United States Patent [19]

Sansbury

[11] 4,355,195

[45] Oct. 19, 1982

[54] ELECTROMAGNETIC SOLAR CELL

[76] Inventor: Ralph Sansbury, GPO Box #1433, New York, N.Y. 10116

[21] Appl. No.: 249,185

[22] Filed: Mar. 30, 1981

Related U.S. Application Data

[63] Continuation-in-part of Ser. No. 168,467, Jul. 14, 1980, abandoned.

[51] Int. Cl.$^3$ ............................................. H01C 31/04
[52] U.S. Cl. ...................................... 136/254; 313/96
[58] Field of Search ..................... 136/254; 313/94–97

[56] References Cited

U.S. PATENT DOCUMENTS

| | | | |
|---|---|---|---|
| 2,453,810 | 11/1948 | Orlove | 313/100 |
| 3,058,022 | 10/1962 | Coleman | 313/96 |
| 3,121,648 | 2/1964 | Jensen | 136/254 |
| 3,143,448 | 8/1964 | Mette et al. | 148/32 |
| 3,218,196 | 11/1965 | Jensen | 136/254 |
| 3,299,306 | 1/1967 | Kapany | 313/95 |
| 4,094,703 | 6/1978 | Williams | 136/254 |
| 4,126,149 | 11/1978 | Reitz | 136/254 |

Primary Examiner—Aaron Weisstuch

[57] ABSTRACT

A solar photocell comprising permanent magnets, polarization and frequency filters and especially prepared alloys increases the photocell current and thereby the efficiency of an electrical generating system containing the photocell and a rechargeable battery.

1 Claim, 1 Drawing Figure

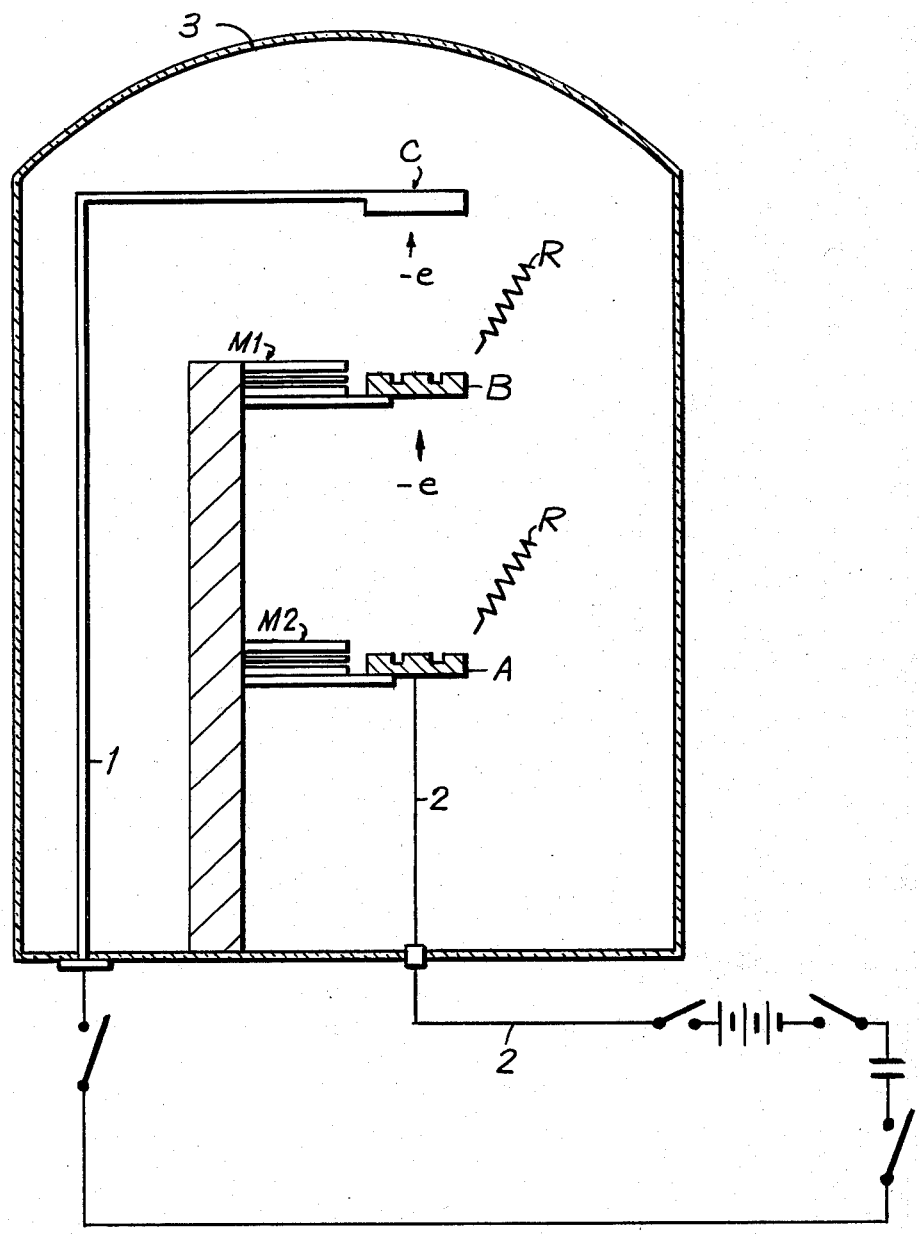

ELECTROMAGNETIC SOLAR CELL

This is a continuation-in-part of application Ser. No. 168,467 filed July 14, 1980, now abandoned.

This invention relates to solar photocells and electrical generating systems. An object of the invention is to improve the efficiency of solar photocells. The ultimate object of the invention is to improve the efficiency of an electrical generating system incorporating a rechargeable battery and a solar photocell to recharge the battery.

The invention is based on newly discovered principles that provide an alternative to the photon interpretation of the photoelectric effect. The photo electric mechanism is interpreted as a resonance reaction of orbiting electrons in the surface atoms of photoemissive materials. The reaction of paramagnetic materials to a magnetic field is interpreted as due to charge polarization within electrons, not electron spin. The theoretical arguments in support of these interpretations are in reference 1[*].

[*] Reference 1: Eletron Structure, Ralph Sansbury April, 1980, A.M. Press ISBN 09603260-5-7

As a consequence of these newly discovered principles, a properly prepared photoemissive element or alloy, e.g., sodium potassium antimony, will respond to an applied magnetic field as follows: There will be a tendency of the orbital plane of the single valence electrons of the photoemissive atoms to become perpendicular or parallel to the lines of force of the applied magnetic field. There will be a component of charge polarization in the electron along the line joining the electron and the nearest nucleus and a component along or perpendicular to a line of force of the magnetic field, at each instant of time.

According to the resonance theory of the photoelectric effect, the orientation of all the lines of the magnetic field and the direction of polarization of light relative to the photoemissive surface are critical factors. Electrons in surface atoms will be ejected perpendicular to the surface more often if the polarization of impinging light of a resonance frequency is perpendicular to the surface and the lines of magnetic force are as described above. Electrons so ejected will be less likely to recombine with the positively charged surfaces than electrons ejected at other trajectories.

A photocell based on these principles is shown in FIGURE 1.

Solar radiation(R) impinges on the photoemissive upper surfaces (A and B), ejecting electrons (e) to the non-photoemissive conductors, 'C' and the lower surface of 'B'. Then 'B' becomes positive and draws the electrons ejected by 'A'. The electrons ejected from 'B' move toward 'C' and are immediately transferred to the ground through the conducting wire '1' or through the rechargeable battery and '2' to 'A'. '3' denotes the glass envelope containing the photoelectric current in the presence of a vacuum or inert gas. Shielded magnets (M1 and M2) 2 cm. long, cylindrical in shape and 0.5 cm. in diameter are placed on a non-conducting support so as to create a strong magnetic field at the surfaces of the photoemissive strips with lines of force coinciding with lines on the upper surface planes. The upper surface plane is crenulated to provide more vertical surface area with which the vertically polarized radiation 'R' may interact. The glass envelope '3' is designed to be transparent to infra red through ultraviolet light and to polarize the light vertically. Some part of the surface of '3' may be opaque. The photoemissive surfaces are deposited by standard vacuum deposition techniques on platinum or polished nickel substrates.

The invention is not to be limited to the particular form disclosed above which is to be regarded as illustrative rather than restrictive. For example the magnets may be arranged so as to produce vertical field lines.

What is claimed is:

1. A solar cell comprising an evacuated glass enclosure; at least one photoactive strip having an upper surface comprising photoemissive material on a crenulated substrate; a non-photoactive strip constituting an anode overlying and spaced from said photoemissive surface(s): wire conductor means attached to each of said anode and the lower, non-photoemissive surface of one of said photoactive strips and leading to the outside of said glass enclosure; shielded magnet means for providing magnetic lines of force coincident with the upper photoemissive surface of said photoactive strip(s); and as part of the glass enclosure or exterior to it a vertical polarization filter and frequency filters to restrict the polarization and frequency of the light impinging on the photoemissive surface(s).

* * * * *